US011705535B2

(12) United States Patent
Jonker et al.

(10) Patent No.: US 11,705,535 B2
(45) Date of Patent: Jul. 18, 2023

(54) NANO-INDENT PROCESS FOR CREATING SINGLE PHOTON EMITTERS IN A TWO-DIMENSIONAL MATERIALS PLATFORM

(71) Applicant: The Government of the United States of America, as represented by the Secretary of the Navy, Arlington, VA (US)

(72) Inventors: Berend T. Jonker, Davidsonville, MD (US); Matthew R. Rosenberger, Arlington, VA (US); Hsun-Jen Chuang, Alexandria, VA (US); Joshua R. Hendrickson, Dayton, OH (US); Chandriker Kavir Dass, Dayton, OH (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 536 days.

(21) Appl. No.: 16/919,024

(22) Filed: Jul. 1, 2020

(65) Prior Publication Data
US 2021/0109127 A1     Apr. 15, 2021

Related U.S. Application Data

(60) Provisional application No. 62/882,936, filed on Aug. 5, 2019.

(51) Int. Cl.
*H01L 33/06*     (2010.01)
*B82Y 20/00*     (2011.01)
(Continued)

(52) U.S. Cl.
CPC .............. *H01L 33/06* (2013.01); *B82Y 20/00* (2013.01); *B82Y 40/00* (2013.01); *G01Q 60/16* (2013.01);
(Continued)

(58) Field of Classification Search
CPC ......... H01L 33/06; H01L 33/26; B82Y 20/00; B82Y 40/00; G01Q 60/16; G01Q 60/38; Y10S 977/856
See application file for complete search history.

(56) References Cited

U.S. PATENT DOCUMENTS 7,976,762 B2 *   7/2011   Stutzmann ............ B29C 59/022
                                                              264/293
9,908,285 B2 *   3/2018   Nam ................... H01L 21/3247
(Continued)

FOREIGN PATENT DOCUMENTS

WO    WO-2018015738 A1 *   1/2018   ........... H01L 27/156

OTHER PUBLICATIONS

Barry et al., "Deterministic strain-induced arrays of quantum emitters in a two-dimensional semiconductor", Nature Communications, May 22, 2017. (Year: 2017).*

*Primary Examiner* — Duy Vu N Deo
*Assistant Examiner* — Christopher Remavege
(74) *Attorney, Agent, or Firm* — US Naval Research Laboratory; Stephen T. Hunnius (57)  ABSTRACT

A nano-indent process for creating a single photon emitter in a two-dimensional materials platform comprising the steps of providing a substrate, providing a layer of polymer, providing a layer of two-dimensional material, utilizing a proximal probe, applying mechanical stress to the layer of two-dimensional material and to the layer of polymer, deforming the layer of two-dimensional material and the layer of polymer, and forming a nano-indent in the two-
(Continued)

dimensional material. A single photon emitter in a two-dimensional materials platform comprising a substrate, a deformable polymer film, a two-dimensional material, and a nano-indent in the two-dimensional material.

9 Claims, 5 Drawing Sheets

(51) Int. Cl.
    *G01Q 80/00*      (2010.01)
    *B82Y 40/00*      (2011.01)
    *G01Q 60/16*      (2010.01)
    *G01Q 60/38*      (2010.01)

(52) U.S. Cl.
    CPC ............. *G01Q 60/38* (2013.01); *G01Q 80/00* (2013.01); *Y10S 977/856* (2013.01)

(56) References Cited

U.S. PATENT DOCUMENTS

| | | | |
|---|---|---|---|
| 11,094,907 B2* | 8/2021 | Fang | H01L 51/0004 |
| 2010/0055413 A1* | 3/2010 | Badyal | B82Y 30/00 |
| | | | 427/256 |
| 2015/0104623 A1* | 4/2015 | Hong | B32B 37/24 |
| | | | 156/220 |
| 2015/0218094 A1* | 8/2015 | Braunschweig | B82Y 40/00 |
| | | | 427/113 |
| 2020/0111868 A1* | 4/2020 | Yang | H01L 29/0665 |

* cited by examiner

NANO-INDENT PROCESS FOR CREATING SINGLE PHOTON EMITTERS IN A TWO-DIMENSIONAL MATERIALS PLATFORM

REFERENCE TO RELATED APPLICATION

This application is a non-provisional of, and claims priority to and the benefits of, U.S. Provisional Patent Application No. 62/882,936 filed on Aug. 5, 2019, the entirety of which is herein incorporated by reference.

BACKGROUND

This disclosure concerns single photon emitters.

Single photon emitters (SPEs), or quantum emitters, are key components in a wide range of nascent quantum-based technologies, including computing, communications, sensing and metrology.

An ideal SPE generates one photon on demand at a high rate, with each photon indistinguishable from another, and is realized in a material platform which enables deterministic placement of SPEs in a fully scalable fashion.

A solid state host offers many advantages for realization of a functional system, but single photon emission often originates from defects such as vacancy complexes whose existence and position are difficult to control with the reliability and nanoscale precision requisite for technological implementation.

SPE behavior has been identified from seemingly random sites in single monolayer transition metal dichalcogenides (TMDs) such as $WSe_2$. These monolayer materials are particularly attractive as an SPE host because they are readily coupled to photonic waveguides, cavities and plasmonic structures, and the emitter is not embedded in a high dielectric environment which would otherwise make extraction of the light difficult.

In addition, SPEs in the TMDs can be electrically driven. Although the detailed origin of quantum emission in the TMDs is unclear, the physical position of the SPE sites are often correlated with areas of high strain. Subsequent work has demonstrated scalable array formation using a prefabricated pillar template over which a $WSe_2$ monolayer is mechanically draped, inducing a strain field in the TMD at the peak of each pillar to localize the SPE with a positioning accuracy of 120±32 nm in the best case.

One potential limitation of this prior art approach is the uncontrolled formation of wrinkles in the TMD around the nano-pillars. These wrinkles form in random orientations that may result in unpredictable and unrepeatable strain profiles.

Disclosed herein is our developed method to encode strain into two dimensional materials (2DM) to create and deterministically place single photon emitters (SPEs) in arbitrary locations with nanometer-scale precision.

SUMMARY OF DISCLOSURE

Description

This disclosure teaches our method and product of a nano-indent process for creating single photon emitters in a two-dimensional materials platform.

This disclosure teaches our method to encode strain into two dimensional materials (2DM) to create and deterministically place single photon emitters (SPEs) in arbitrary locations with nanometer-scale precision.

Our material platform consists of a 2DM placed on top of a deformable polymer film. Upon application of sufficient mechanical stress using a proximal probe such as an atomic force microscope tip, the 2DM/polymer composite deforms, resulting in formation of highly localized strain fields with excellent control and repeatability.

We show that electronic states are created and localized at these nanoindents, and exhibit or comprise single photon emission.

This quantum calligraphy allows deterministic placement and real time design of arbitrary patterns of SPEs for facile coupling with photonic waveguides, cavities and plasmonic structures.

In addition to enabling versatile placement of SPEs, these results present a general methodology for imparting strain into 2DM with nanometer-scale precision, providing an invaluable tool for further investigations and future applications of strain engineering of 2DM and 2DM devices.

DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings.

DETAILED DESCRIPTION OF THE INVENTION

This disclosure teaches our method and product of a nano-indent process for creating single photon emitters in a two-dimensional materials platform.

This disclosure teaches our method to encode strain into two dimensional materials (2DM) to create and deterministically place single photon emitters (SPEs) in arbitrary locations with nanometer-scale precision.

Our material platform consists of a 2DM placed on top of a deformable polymer film. Upon application of sufficient mechanical stress using a proximal probe such as an atomic force microscope tip, the 2DM/polymer composite deforms, resulting in formation of highly localized strain fields with excellent control and repeatability.

We show that new electronics states are created and localized at these nanoindents, and exhibit single photon emission.

This quantum calligraphy allows deterministic placement and real time design of arbitrary patterns of SPEs for facile coupling with photonic waveguides, cavities and plasmonic structures.

In addition to enabling versatile placement of SPEs, these results present a general methodology for imparting strain into 2DM with nanometer-scale precision, providing an invaluable tool for further investigations and future applications of strain engineering of 2DM and 2DM devices.

This nano-indent process for creating single photon emitters in a two-dimensional materials platform can form a trench in the layer of two-dimensional material. The single photon emitter in a two-dimensional materials platform can comprise a trench in the two-dimensional material and the deformable polymer layer, wherein the trench comprises a permanent and localized strain field formed by application of mechanical stress from a tip of an atomic force microscope to the two-dimensional material and the deformable polymer film.

Two-dimensional materials (2DM) such as graphene and the TMDs exhibit many intriguing mechanical, electronic, and optoelectronic properties that make them promising for a wide range of applications, including flexible and transparent electronics, conformal optoelectronics, and sensing. Strain engineering is a particularly exciting possibility for 2DM due to their small stiffness for out-of-plane displacements and high strain limits (up to 30%). Strain engineering can significantly modify the optical properties, and can demonstrated at the wafer-scale by modifying substrate and 2DM relative thermal expansion during growth.

Example 1

We describe here a means and mechanism to generate local strain fields and write single or multiple single photon emitters in patterns or arrays in a 2DM with nanometer-scale precision.

We teach specifically to deterministically create quantum emitters in two dimensional semiconductors at a selected position with nanometer precision using a materials platform consisting of a transition metal dichalcogenide layer on a deformable substrate.

As an example, we use an atomic force microscope (AFM) to form nanoindents in monolayer $WSe_2$ on a poly (methyl methacrylate) (PMMA)/$SiO_2$/Si substrate with positioning accuracy limited by the AFM and the width of the nanoindent.

We demonstrate the ability to control the depth of indentation by controlling the applied load and achieve good process repeatability.

Example 2

We demonstrate that quantum emitters are created and localized at our specific nanoindents.

These emitters are bright, producing photon rates of $10^5$/sec at low laser pump powers (~10 nw/$um^2$) with low spectral wandering. This quantum calligraphy allows deterministic placement and real time design of arbitrary patterns of SPEs for facile coupling with photonic waveguides, cavities and plasmonic structures.

Example 3

The teachings described herein and our results also indicate that a nano-imprinting approach will be effective in creating large arrays or patterns of quantum emitters for wafer scale manufacturing of quantum photonic systems.

Example 4

The technique uses a simple material platform consisting of a 2DM on top of a polymer layer. After indentation with an AFM tip, the polymer layer serves as a deformable layer which holds the 2DM in place, forcing it to follow a deformation contour and resulting in a highly localized strain field or nanoindent with the 2DM.

Example 5

Figure 1:
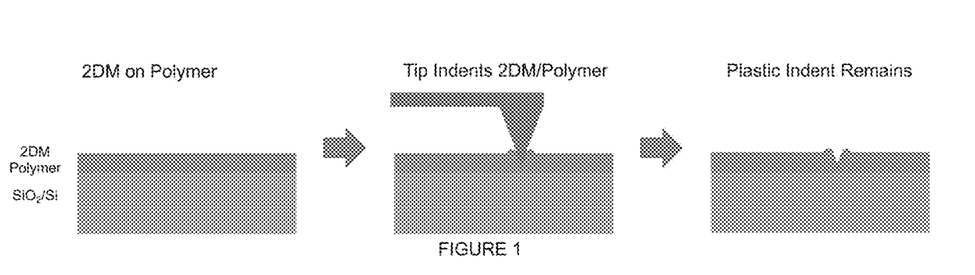
FIG. 1 illustrates a schematic of the 2DM/polymer structure used in the experiments. The AFM tip applies sufficient load to plastically deform the polymer. The adhesive interaction between the 2DM and polymer is strong enough to hold the 2DM in place, thus imparting strain to the 2DM.

FIG. 1 shows the concept for local strain engineering of 2DM using an AFM tip. The 2DM is transferred onto a polymer layer that serves as a deformable substrate, as shown in FIG. 1. Bringing the cantilever into contact with a small applied load leads only to elastic deformation of the surface, producing no permanent indent. At a critical load, the polymer begins to plastically deform, resulting in a permanent indent in the material. The 2D layer is deformed with the polymer while the AFM tip is in contact, resulting in tensile strain buildup in the 2D layer, as shown in FIG. 1. When the AFM tip is removed, the adhesive interaction between the polymer and the 2D layer prevents the 2D layer from relaxing back to its original, strain-free geometry, which results in a permanent strain applied to the 2D layer, as shown in FIG. 1.

Example 6

Figure 2:
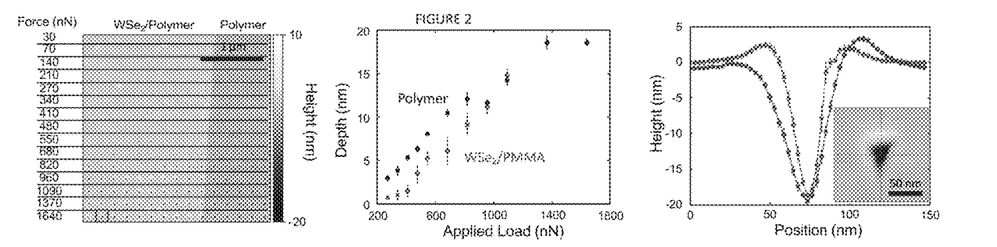
FIG. 2 illustrates an AFM image after a grid of AFM indents made with sharp tip and a range of applied force from 30-1640 nN. The sample was $WSe_2$/PMMA (70 nm). Indent depth as a function of applied load is also illustrated. Bars represent standard deviation of nominally identical indents. Line profiles averaged from nine nominally identical indents along the lines labeled in the inset image. The inset image is a closeup of the indent labeled with the box in leftmost illustration. The error bars represent standard deviation.

FIG. 2 demonstrates our ability to control the indent geometry by controlling the applied load. FIG. 2 shows the sample topography at the edge of a $WSe_2$ flake on a 70 nm thick PMMA layer after numerous indents have been formed with applied loads varying from 30 nN to 1640 nN. Each row of fifteen indents correspond to indents with the same applied load. FIG. 2 shows the maximum indent depth as a function of applied load for both the bare polymer layer and the $WSe_2$/polymer composite. As expected, increased load leads to increased indent depth. AFM indenting of 2DM/ polymer composites has good repeatability due to the precise force control of the AFM and the predictability with which polymers plastically deform. The average standard deviation for the $WSe_2$/polymer indent depth in FIG. 2 is 0.8 nm, which highlights the excellent repeatability of AFM indenting.

Example 7

In addition to enabling excellent depth repeatability, AFM indenting can create nearly identical indent shapes, which is a significant improvement over existing strategies for strain-engineering. FIG. 2 shows two cross sectional profiles of an indent produced with 1640 nN applied load. The one curve corresponds to the cross-section along the horizontal dashed line shown in the inset. The second curve corresponds to the cross-section along the vertical dashed line in the inset. The error bars on the curves correspond to the standard deviation of 9 indents created with the same applied load. The average standard deviation within the indent (position=50 nm to 90 nm) is 1.0 nm for the horizontal cross section and 0.7 nm for the vertical cross section.

Example 8

Importantly, the 2DM/polymer composite scheme and subsequent AFM indenting to produce strain can be extended to any choice of 2DM and also to van der Waals heterostructures (i.e. stacks of multiple 2DM). The ability to apply strain with nanometer-scale precision to 2DM and van der Waals heterostructures offers exciting possibilities for controlling electronic and optoelectronic behavior of these materials.

Example 9

Figure 3:
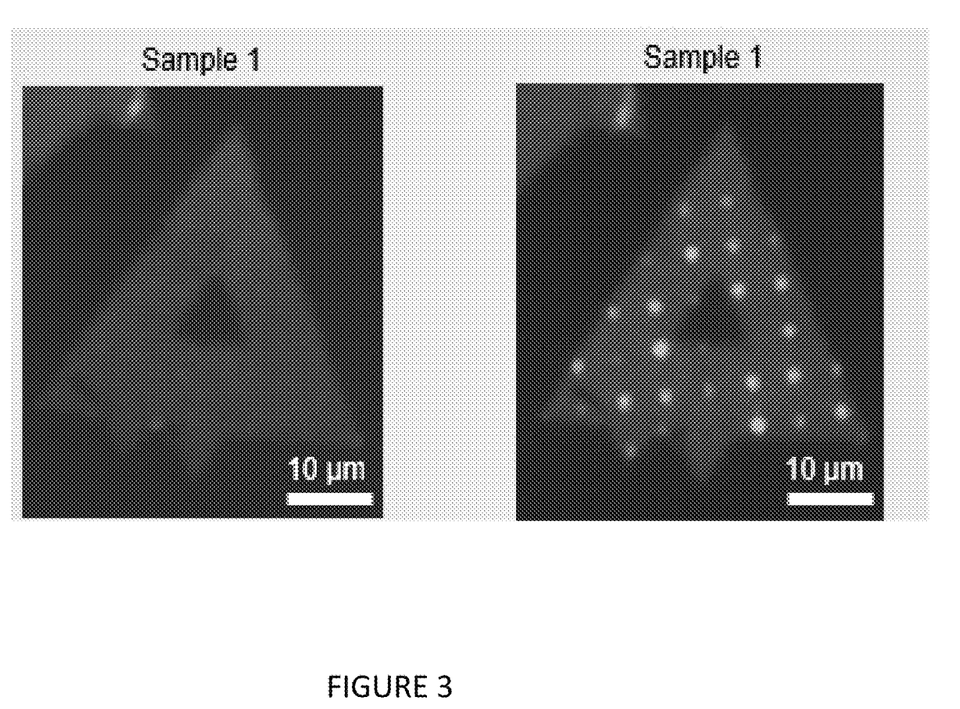
FIG. 3 illustrates a demonstration of SPE localization using the AFM indenting technique. Illustrated is a fluorescence image of Sample 1 before AFM indentation. Sample 1 was $WSe_2$ on 320 nm of PMMA. Also illustrated is a fluorescence image of the same triangle after a grid of AFM indents were made into the sample.

FIG. 3 demonstrates that AFM indents can induce localized single photon emission. FIG. 3 shows a fluorescence image taken at 5 K of a $WSe_2$ triangle grown by chemical vapor deposition after transfer onto a 320 nm layer of PMMA. The triangle exhibits nearly uniform fluorescence across the monolayer portion of triangle. The center of the triangle corresponds to multilayer $WSe_2$ and exhibits considerably less intense fluorescence, as expected for an indirect bandgap semiconductor. FIG. 3 shows a fluorescence image of the same triangle after a grid of indents were made using a 2000 nm cantilever displacement. There is a clear enhancement of emission at the locations of the indents.

Example 10

Figure 4:
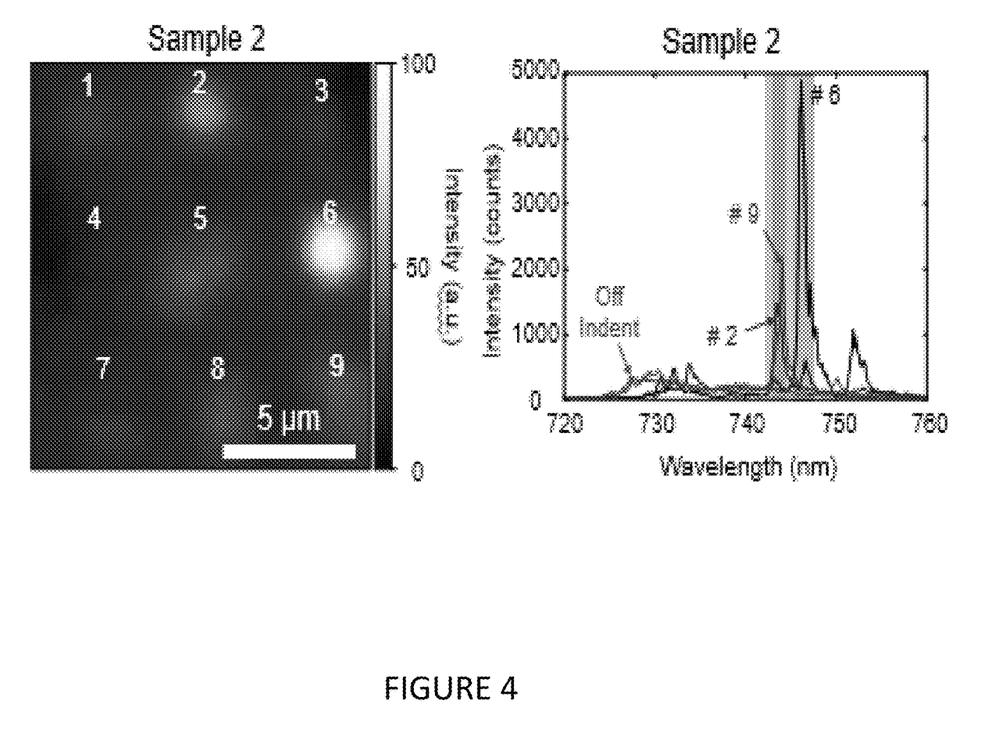
FIG. 4 illustrates an integrated photoluminescence (PL) intensity from 1.55 to 1.7 eV for nine indents on Sample 2, which was $WSe_2$ on 70 nm of PMMA. There is increased intensity at the indent locations. Also illustrated are PL spectra for indents 2, 6, and 9 and away from the indented regions.

FIG. 4 shows a map of integrated photoluminescence (PL) intensity from 1.55 eV to 1.7 eV for 9 indents made on a different sample (Sample 2), which consists of $WSe_2$ on 70 nm PMMA. We indented locations 1, 2, and 3 with 800 nm cantilever displacement, locations 4, 5, and 6 with 1000 nm cantilever displacement, and locations 7, 8, and 9 with 1200 nm cantilever displacement. There is an obvious increase in PL intensity for all indents except indent 4, which occurs near the interface between a monolayer region and a multilayer region, likely resulting in suppressed PL relative to the other indents which are well within the monolayer region. FIG. 4 shows the PL spectrum at 3.8 K from indents 2, 6, and 9 and the PL spectrum away from the indented regions. All of the spectra exhibit sharp spectral features compared to the spectrum away from the indented regions. The other indents also exhibited similar sharp spectral features, but are not shown here for clarity. These sharp features are typical of SPEs seen in $WSe_2$ in past work.

Example 11

Figure 5:
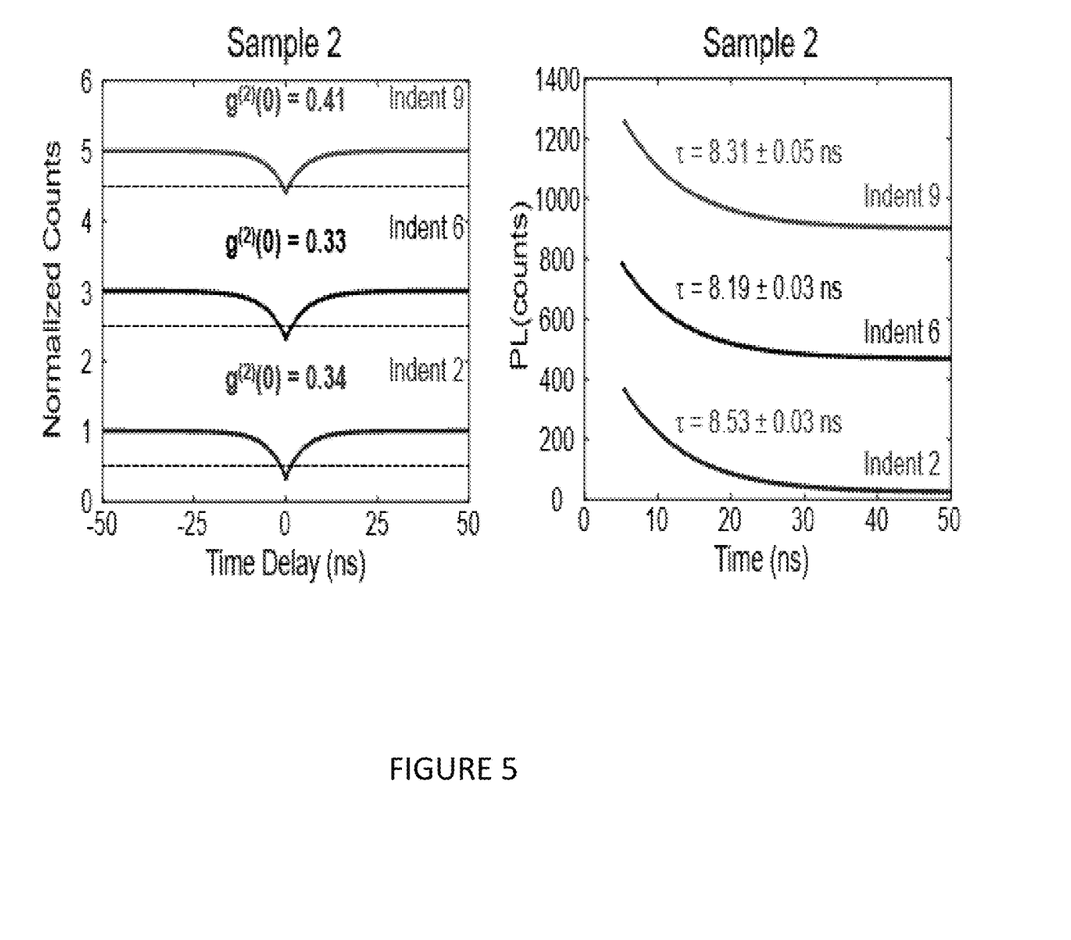
FIG. 5 illustrates an antibunching experiment for indents 2, 6, and 9. $g^{(2)}(0)=0.34$ for indent 2, $g^{(2)}(0)=0.33$ for indent 6, and $g^{(2)}(0)=0.41$ for indent 9. The dashed lines represent $g^{(2)}(0)=0.5$. Time-resolved PL measurements of indents 2, 6, and 9 are illustrated. A single exponential fit resulted in a time constant of 8.53±0.03 ns for indent 2, $\tau=8.19\pm0.03$ ns for indent 6, and $\tau=8.31\pm0.05$ ns for indent 9. All data were taken at approximately 4 K.

FIG. 5 shows the intensity autocorrelation function, $g^{(2)}$(tau), obtained for one of the sharp features from indents 2, 6, and 9 (identified by the shaded regions), demonstrating antibunching behavior. The most important information from this experiment is $g^{(2)}(0)$, which corresponds to the likelihood that two photons are emitted at the same time (i.e. with a time delay of 0 seconds). From these measurements, $g^{(2)}(0)=0.34$ for indent 2, 0.33 for indent 6, and 0.41 for indent 9. Values of $g^{(2)}(0)<0.5$ confirm that each of these features is a SPE, proving that the AFM indentation technique can spatially localize SPEs. We attribute the fact that these $g^{(2)}(0)$ values are not closer to zero (as expected for an ideal SPE) to use of an incident laser spot size of approximately 1-2 μm, which is much larger than the indented region, resulting in excitation and collection of normal emission from the non-indented surrounding area. We have observed that $g^{(2)}(0)$ reaches smaller values for SPEs that are spectrally removed from the broad background signal, which supports our theory that collection of background emission increases the value of $g^{(2)}(0)$.

Example 12

FIG. 5 shows time-resolved PL measurements of indents 2, 6, and 9 taken at T=4K. Using a single exponential fit of the form $I(t)=I_0 e^{-t/t}$, where I is PL intensity, $I_0$ is the maximum PL intensity, t is time, and t is the lifetime, we extracted lifetimes of 8.53±0.03 ns for indent 2, of 8.19±0.03 ns for indent 6, and of 8.31±0.05 ns for indent 9. The similarity of the lifetimes for each indent further demonstrates the repeatability of our approach and suggests a similar origin for each of these emitters.

Advantages

Some, but not all, of our advantages are listed.

First, this approach provides deterministic creation of an SPE, in contrast with previous reports of SPEs in 2DM where the SPE pre-existed due to unknown circumstances.

Second, this approach provides deterministic placement of an SPE at a desired location with nanoscale precision limited by the proximal probe used, in contrast with previous reports of SPE in 2DM where the SPE was observed at seemingly random locations.

Third, this approach provides for the creation of arrays of SPEs in any pattern desired.

Fourth, this approach provides for facile placement and coupling of SPEs with photonic waveguides, cavities and plasmonic structures.

Fifth, this approach is compatible with wafer scale manufacturing.

Sixth, this approach provides a general methodology for imparting strain into 2DM with nanometer-scale precision, providing an invaluable tool for further investigations and future applications of strain engineering of 2DM and 2DM devices.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been illustrated and/or described with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What we claim is:

1. A nano-indent process for creating a single photon emitter in a two-dimensional materials platform, comprising the steps of:
   providing a substrate;
   providing a layer of polymer on the substrate;
   providing a layer of two-dimensional material on the layer of polymer on the substrate;
   utilizing a proximal
   probe to apply mechanical stress to the layer of two-dimensional material and to the layer of polymer;
   deforming the layer of two-dimensional material and the layer of polymer; and
   forming a nano-indent in the two-dimensional material;
   wherein the nano-indent comprises a single photon emitter.

2. The nano-indent process for creating a single photon emitter in a two-dimensional materials platform of claim 1, wherein the nano-indent comprises a localized strain field.

3. The nano-indent process for creating a single photon emitter in a two-dimensional materials platform of claim 2, wherein the localized strain field is a permanent localized strain field.

4. The nano-indent process for creating a single photon emitter in a two-dimensional materials platform of claim 3, wherein the step of utilizing a proximal probe comprises utilizing a tip of an atomic force microscope.

5. The nano-indent process for creating single photon emitters in a two-dimensional materials platform of claim 1, further comprising the step of:
   forming a trench in the layer of two-dimensional material.

6. The nano-indent process for creating single photon emitters in a two-dimensional materials platform of claim 1, wherein the layer of polymer comprises PMMA; wherein the two-dimensional material on the layer of polymer comprises $WSe_2$.

7. A single photon emitter in a two-dimensional materials platform, comprising:
   a substrate;
   a deformable polymer film on the substrate;
   a two-dimensional material on the deformable polymer film; and
   a nano-indent in the two-dimensional material and the deformable polymer film;
   wherein the nano-indent comprises a permanent and localized strain field formed by application of mechanical stress from a tip of an atomic force microscope to the two-dimensional material and the deformable polymer film; and
   wherein the nano-indent exhibits single photon emission in the two-dimensional material.

8. The single photon emitter in a two-dimensional materials platform of claim 7,
   wherein the deformable polymer film comprises PMMA; and
   wherein the two-dimensional material on the deformable polymer film comprises $WSe_2$.

9. The single photon emitter in a two-dimensional materials platform of claim 7, further comprising:
   a trench in the two-dimensional material and the deformable polymer layer;
   wherein the trench comprises a permanent and localized strain field formed by application of mechanical stress from a tip of an atomic force microscope to the two-dimensional material and the deformable polymer film.

* * * * *